(12) United States Patent
Ching et al.

(10) Patent No.: US 6,797,075 B2
(45) Date of Patent: Sep. 28, 2004

(54) FERRIS WHEEL-LIKE STRIPPING OR CLEANING MECHANISM FOR SEMICONDUCTOR FABRICATION

(75) Inventors: Kai-Ming Ching, Taiping (TW); Chia-Fu Lin, Hsin-Chu (TW); Wen-Hsiang Tseng, Hsinchu (TW); Ta-Min Lin, Hsinchu (TW); Yen-Ming Chen, Hsin-Chu (TW); Hsin-Hui Lee, Kaohsiung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 47 days.

(21) Appl. No.: 10/143,053

(22) Filed: May 9, 2002

(65) Prior Publication Data

US 2003/0209260 A1 Nov. 13, 2003

(51) Int. Cl.[7] .............................. B08B 1/04; B08B 3/08
(52) U.S. Cl. ........................ 134/32; 134/33; 134/142; 134/157
(58) Field of Search ..................... 134/32, 33, 42, 134/140, 142, 147, 157, 161

(56) References Cited

U.S. PATENT DOCUMENTS

| | | | | |
|---|---|---|---|---|
| 936,237 A | * | 10/1909 | Curran | 134/142 |
| 4,516,523 A | * | 5/1985 | Knox | 118/500 |
| 4,594,229 A | * | 6/1986 | Ciszek et al. | 422/245.1 |
| 4,701,096 A | * | 10/1987 | Fisher, Jr. | 414/416.08 |
| 4,886,412 A | * | 12/1989 | Wooding et al. | 414/416.05 |
| 5,672,212 A | * | 9/1997 | Manos | 134/1.3 |
| 5,810,028 A | * | 9/1998 | Ichikawa et al. | 134/66 |
| 5,951,763 A | * | 9/1999 | Knox | 118/409 |
| 6,439,822 B1 | * | 8/2002 | Kimura et al. | 414/331.04 |

OTHER PUBLICATIONS

"Microchip Fabrication: A Practical Guide to Semiconductor Processing", Peter Van Zant—4th ed., 2000, p. 271.

* cited by examiner

*Primary Examiner*—Randy Gulakowski
*Assistant Examiner*—Saeed Chaudhry
(74) *Attorney, Agent, or Firm*—Tung & Associates

(57) ABSTRACT

A Ferris wheel-like stripping or cleaning mechanism that can be used in semiconductor fabrication, such as in photoresist or other stripping, or wafer or other cleaning, is disclosed. A stripping mechanism can include a container to hold a chemical, such as a photoresist stripping chemical, a wafer cleaning chemical, or another type of chemical. The mechanism can also include a component to move semiconductor wafers through the chemical in the container in a Ferris wheel-like motion. The component may include wafer holders for the wafers that are swivably mounted about an axis of rotation. As the one or more wafer holders rotate about the axis of rotation through the chemical in the container, the wafer holders remain in a substantially constant vertical and horizontal orientation.

18 Claims, 6 Drawing Sheets

FERRIS WHEEL-LIKE STRIPPING OR CLEANING MECHANISM FOR SEMICONDUCTOR FABRICATION

FIELD OF THE INVENTION

This invention relates generally to stripping or cleaning as is accomplished during semiconductor fabrication, such as photoresist stripping or wafer cleaning, and more particularly to mechanisms to perform such stripping and cleaning.

BACKGROUND OF THE INVENTION

There are four basic operations in semiconductor processing, layering, patterning, doping, and heat treatments. Layering is the operation used to add thin layers to the surface of a semiconductor wafer. Patterning is the series of steps that results in the removal of selected portions of the layers added in layering. Doping is the process that puts specific amounts of dopants in the wafer surface through openings in the surface layers. Finally, heat treatments are the operations in which the wafer is heated and cooled to achieve specific results, where no additional material is added or removed from the wafer.

Of these four basic operations, patterning is typically the most critical. The patterning operation creates the surface parts of the devices that make up a circuit on the semiconductor wafer. The operation sets the critical dimensions of these devices. Errors during patterning can cause distorted or misplaced defects that result in changes in the electrical function of the device, as well as device defects.

The patterning process is also known by the terms photomasking, masking, photolithography, and microlithography, and involves photoresist stripping. The process is a multi-step process similar to photography or stenciling. The removal of a photoresist layer is accomplished by either wet or dry etching. Wet etching refers to the use of wet chemical processing to remove the photoresist. The chemicals are placed on the surface of the wafer, or the wafer itself is submerged in the chemicals. Dry etching refers to the use of plasma stripping, using a gas such as oxygen ($O_2$), $C_2F_6$ and $O_2$, or another gas. Whereas wet etching is a low-temperature process, dry etching is typically a high-temperature process.

The etching process is also referred to as stripping, such as stripping photoresist, including dry film photoresist or liquid photoresist. In wet etching, a semiconductor wafer having photoresist on it is submersed in a stripping chemical or agent and agitated to remove the photoresist. The photoresist is thus sensitive to the chemical cleaning agent. Within the prior art, the relative motion between the chemical and the semiconductor wafer is one dimensional in nature, such as in the y or z directions. FIGS. 1 and 2 show examples of how stripping, such as photoresist stripping, is current accomplished.

In FIG. 1, a side view of the system 100 includes semiconductor wafers 112 being held by a semiconductor wafer holder 110 in a vertical orientation, such as along the z direction. The holder 110, and thus the wafers 112, are submersed in a chemical solution 104 being stored in a container 102. A cylinder 106 is connected to the holder 110 via a rigid arm 108. The cylinder moves up and down in the z direction, as indicated by the arrows 114. This causes the holder 110, and thus the wafers 112, to also move up and down within the solution 104, as indicated by the arrows 116.

In FIG. 2, a top view the system 200 includes a chemical solution 204 being stored in a container 202. The semiconductor wafer 206 is moved back and forth in the y direction, as indicated by the arrows 208 and 210. Thus, the semiconductor wafer 206 goes between the position 206a and the position 206c, temporarily occupying the position 206b. The semiconductor wafer 206 is submersed in the chemical solution 204.

However, the photoresist stripping mechanisms of FIGS. 1 and 2 are disadvantageous. For instance, photoresist stripping in the context of a bump process, as this process is known within the art, may have to remove photoresist that is as thick as 120 micron. The thick photoresist is situated between the bumps in a clamped pattern, making the photoresist difficult to strip. Using the photoresist stripping mechanisms of FIGS. 1 and 2 typically leads to some photoresist residue. That is, the one-dimensional relative motion between the wafers and the chemical solution is insufficient to clean all the photoresist from the wafers, leaving photoresist residue.

Therefore, there is a need for an improved stripping mechanism that overcomes these disadvantages. Such a stripping mechanism should be useable in the context of stripping photoresist. The stripping mechanism should remove substantially all the photoresist from semiconductor wafers, even in the context of bumps, without leaving photoresist residue. For these and other reasons, there is a need for the present invention.

SUMMARY OF THE INVENTION

The invention relates to a Ferris wheel-like stripping or cleaning mechanism that can be used in semiconductor fabrication. A mechanism can include a container to hold a chemical. The mechanism can also include a component to move semiconductor wafers through the chemical in the container in a Ferris wheel-like motion. The component may include wafer holders for the wafers that are swivably mounted about an axis of rotation. As the one or more wafer holders rotate about the axis of rotation through the chemical in the container, the wafer holders remain in a substantially constant vertical and horizontal orientation.

Embodiments of the invention provide for advantages not found within the prior art. The Ferris wheel-like stripping or cleaning mechanism ensures that there is two-dimensional relative motion between the semiconductor wafers and the chemical solution. This added dimension of motion, or agitation, has been found to remove substantially all the photoresist from semiconductor wafers, even in the context of bumps, without leaving substantial photoresist residue, where the inventive mechanism is used for photoresist stripping. Where the inventive mechanism is used for cleaning polymer from a wafer after metal or via etching, it has been found that the mechanism successfully removes the polymer that even is situated in sidewalls. Still other aspects, embodiments, and advantages of the invention will become apparent by reading the detailed description that follows, and by referring to the accompanying figures.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. For instance, whereas the invention is substantially described in relation to photoresist stripping, it is applicable to wafer cleaning as well, such as cleaning polymer after metal or via etching. The following detailed description is, therefore, not to be taken in a limiting sense, and the scope of the present invention is defined only by the appended claims.

Figure 1:
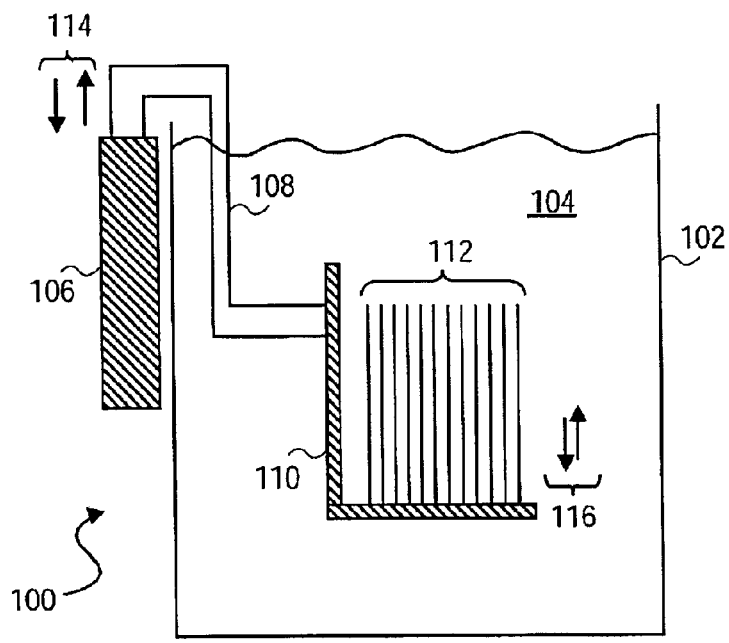
FIG. 1 is a diagram showing a side view of a conventional stripping mechanism that provides for only one-dimensional relative motion between a semiconductor wafer and a chemical cleaning agent, according to the prior art.
Figure 2:
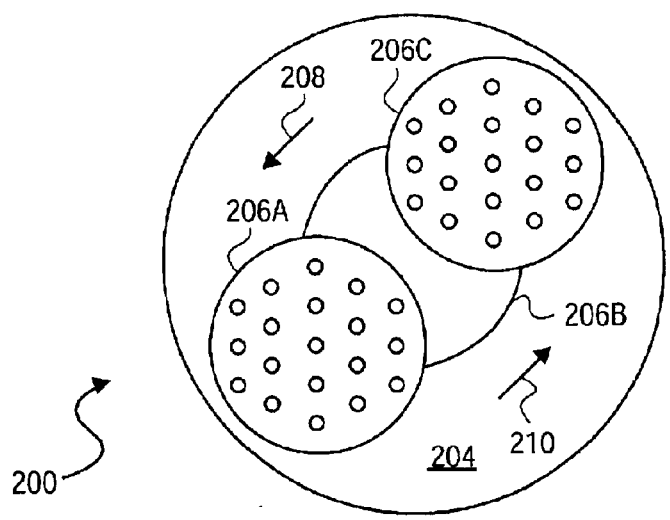
FIG. 2 is a diagram showing a top view of another conventional stripping mechanism that provides for only one-dimensional relative motion between a semiconductor wafer and a chemical cleaning agent, according to the prior art.
Figure 3B:
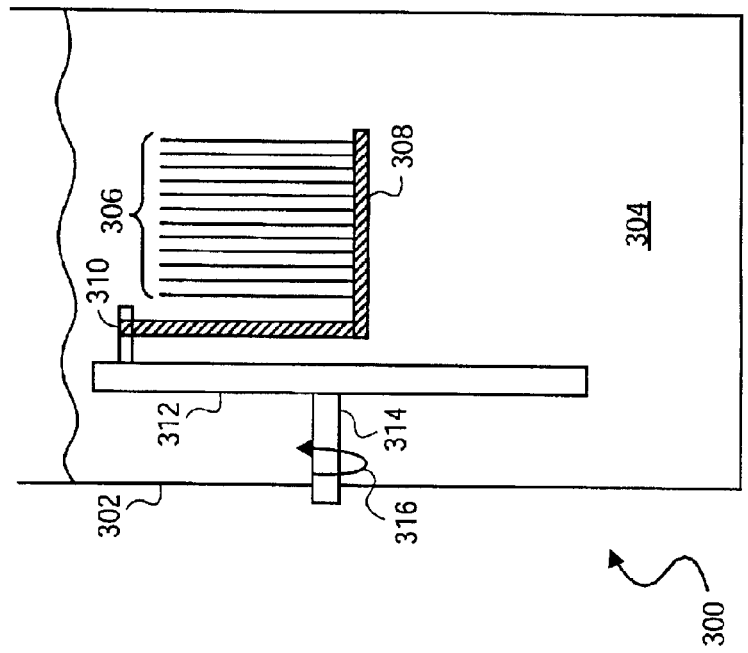
FIGS. 3A and 3B are diagrams showing a front view and a side view, respectively, of a Ferris wheel-like stripping mechanism with one wafer holder on a wheel that provides for two-dimensional relative motion between semiconductor wafers and a chemical cleaning agent, according to an embodiment of the invention.
Figure 3A:
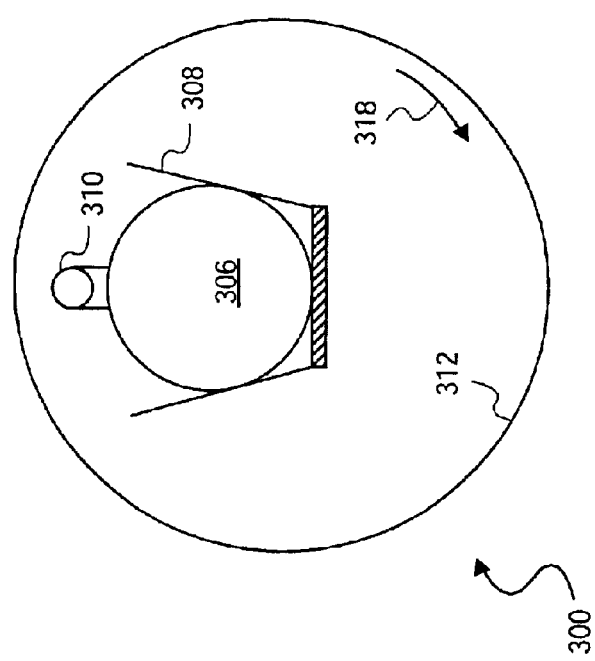

FIGS. 3A and 3B show a stripping mechanism 300 for use in semiconductor fabrication, according to an embodiment of the invention. The stripping may be photoresist stripping, or another type of stripping. The stripping mechanism 300 includes a container 302 that holds a stripping chemical agent or solution 304. Parts 308, 310, 312, and 314 of the mechanism 300 act as a component to move the semiconductor wafers 306 through the stripping chemical 304 in a Ferris wheel-like motion. That is, the wafers 306 rotate, as indicated by the arrow 318, around an axis of rotation, coincident with the gear 314, but during rotation they do not substantially change their horizontal or vertical orientation. That is, the parts of the wafers 306 pointing up in one position during rotation are the same parts of the wafers 306 that point up in the other positions during rotation. The rotation may be between 0.5 and 100 revolutions per minute (RPM).

More specifically, the mechanism 300 includes a semiconductor wafer holder 308 that is swivably mounted, as indicated as the mount 310, to a rotatable wheel 312. The swivable mounting of the holder 308 to the wheel 312 allows the holder 308 to maintain substantially its horizontal and vertical configuration as the wheel 312 rotates. The wheel 312 rotates because it is mounted to a gear 314, corresponding to the axis of rotation, that rotates as indicated by the arrow 316. The rotation of the wheel 312 correspondingly causes the semiconductor wafer holder 308, and its semiconductor wafers 306, to rotate, as indicated by the arrow 318. The rotation of the semiconductor wafers 306 about the axis of rotation in the semiconductor wafer holder 308, while maintaining a substantially constant horizontal and vertical configuration, allows for two-dimensional relative motion between the wafers 306 and the chemical 304.

Figure 4B:
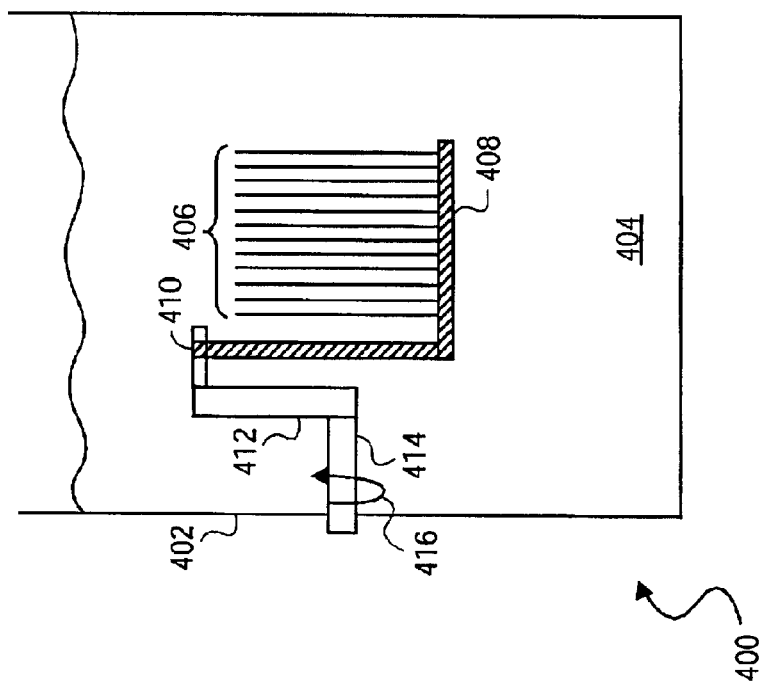
FIGS. 4A and 4B are diagrams showing a front view and a side view, respectively, of a Ferris wheel-like stripping mechanism with one wafer holder on a spoke that provides for two-dimensional relative motion between semiconductor wafers and a chemical cleaning agent, according to another embodiment of the invention.
Figure 4A:
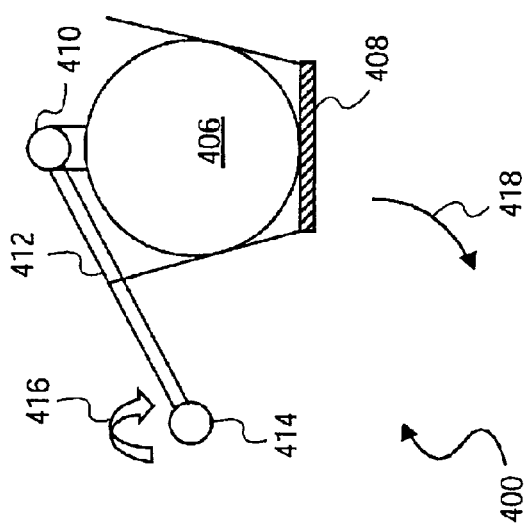

FIGS. 4A and 4B show a stripping mechanism 400 for use in semiconductor fabrication, according to another embodiment of the invention. The stripping mechanism 400 includes a container 402 that holds a stripping chemical 404. Parts 408, 410, 412, and 414 of the mechanism 400 act as a component to move the semiconductor wafers 406 through the stripping chemical 404 in a Ferris wheel-like motion. That is, the wafers 406 rotate, as indicated by the arrow 418, around an axis of rotation, coincident with the gear 414, but during rotation they do not substantially change their horizontal or vertical orientation. That is, the parts of the wafers 406 pointing down in one position during rotation are the same parts of the wafers 406 that point down in the other positions during rotation. The rotation may be between 0.5 and 100 RPM.

More specifically, the mechanism 400 includes a semiconductor wafer holder 408 that is swivably mounted, as indicated as the mount 410, to a rotatable spoke 412. The swivable mounting of the holder 408 to the spoke 412 allows the holder 408 to maintain substantially its horizontal and vertical configuration as the spoke 412 rotates. The spoke 412 rotates because it is mounted to a gear 414 on one end, where the other end is mounted as the mount 410 to the to the wafer holder 408. The gear 414 corresponds to the axis of rotation, and rotates as indicated by the arrow 416. The rotation of the spoke 412 correspondingly causes the wafer holder 408, and its wafers 406, to rotate, as indicated by the arrow 418. The rotation of the wafers 406 about the axis of rotation in the wafer holder 408, while maintaining a substantially constant horizontal and vertical configuration, allows for two-dimensional relative motion between the wafers 406 and the chemical 404.

Figure 5B:
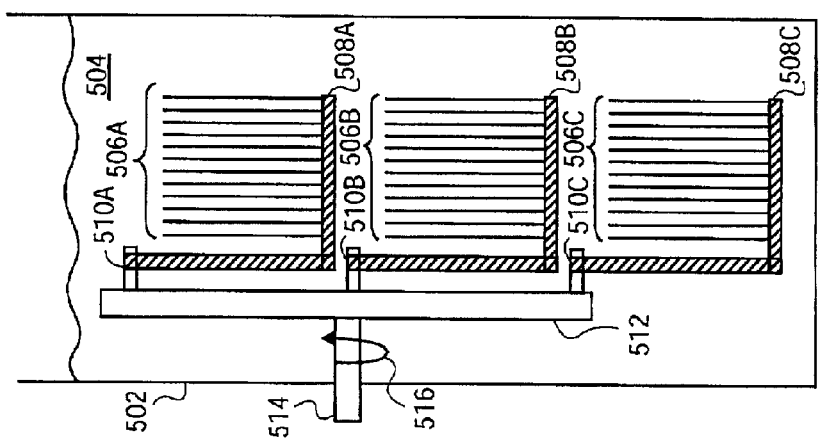
FIGS. 5A and 5B are diagrams showing a front view and a side view, respectively, of a Ferris wheel-like stripping mechanism with wafer holders on a wheel that provides for two-dimensional relative motion between semiconductor wafers and a chemical cleaning agent, according to still another embodiment of the invention.
Figure 5A:
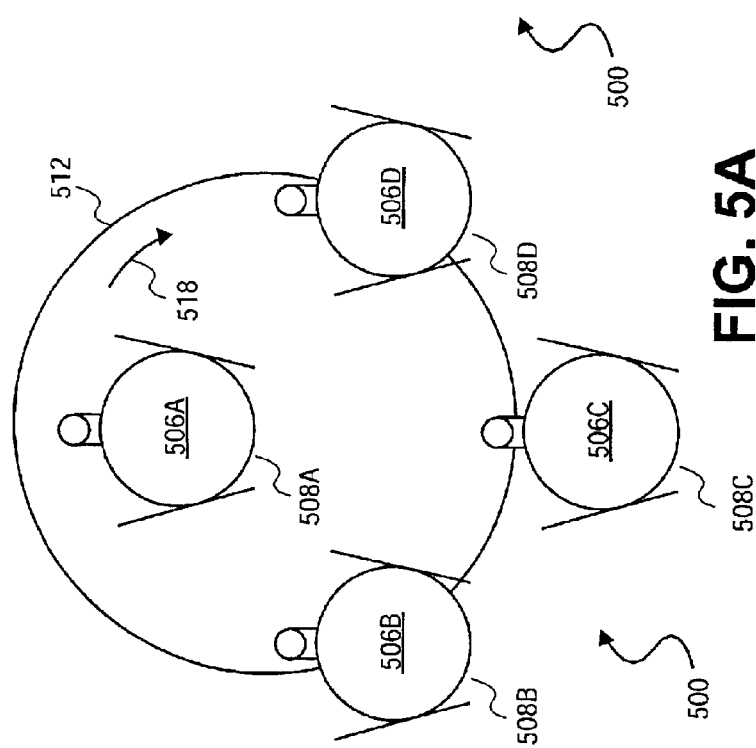

FIGS. 5A and 5B show a stripping mechanism 500 for use in semiconductor fabrication, according to another embodiment of the invention. The stripping mechanism 500 is similar to the stripping mechanism 300 of FIGS. 3A and 3B. The difference is that the stripping mechanism 500 has four semiconductor wafer holders 508a, 508b, 508c, and 508d swivably mounted to a wheel 512. Only wafer holders 508a, 508b, and 508c are viewable in FIG. 5B, and thus only the mounts 510a, 510b, and 510c indicating the swivable mounting of the holders 508a, 508b, and 508c to the wheel 512 are shown in FIG. 5B. The semiconductor wafers stored in the holders 508a, 508b, 508c, and 508d are indicated as the wafers 506a, 506b, 506c, and 506d. Except for the increased number of semiconductor wafer holders, the stripping mechanism 500 otherwise operates as does the stripping mechanism 300 of FIGS. 3A and 3B.

Thus, the swivable mounting of the holders 508a, 508b, 508c, and 508d to the wheel 512 allows the holders 508a, 508b, 508c, and 508d to maintain substantially their horizontal and vertical configuration as the wheel 512 rotates. The wheel 512 rotates because it is mounted to a gear 514, corresponding to the axis of rotation, that rotates as indicated by the arrow 516. The rotation of the wheel 512 correspondingly causes the holders 508a, 508b, 508c, and 508d, and their wafers 506a, 506b, 506c, and 506d, to rotate, as indicated by the arrow 518. The rotation of the wafers 506a, 506b, 506c, and 506d about the axis of rotation, while maintaining a substantially constant horizontal and vertical configuration, allows for two-dimensional relative motion between the wafers 506a, 506b, 506c, and 506d and the chemical 504 in the container 502.

Figure 6B:
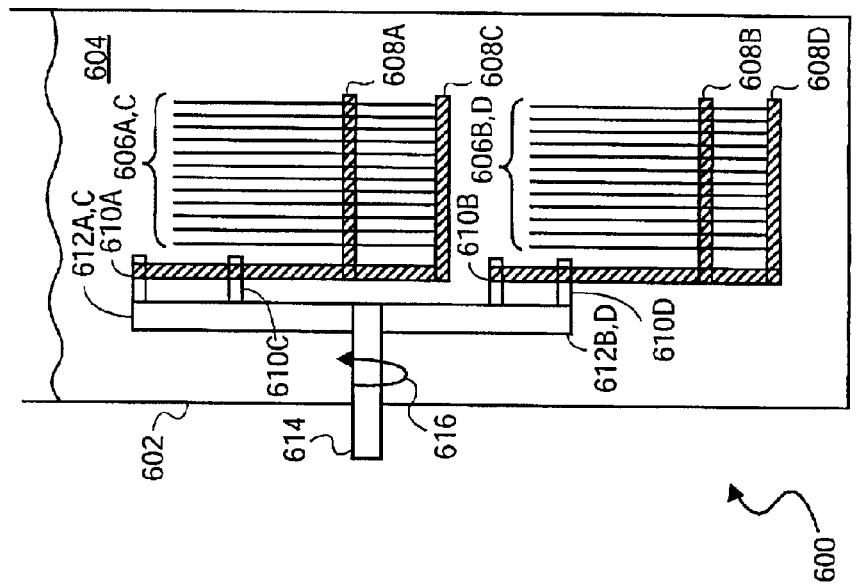
FIGS. 6A and 6B are diagrams showing a front view and a side view, respectively, of a Ferris wheel-like stripping mechanism with wafer holders on spokes that provides for two-dimensional relative motion between semiconductor wafers and a chemical cleaning agent, according to still another embodiment of the invention.
Figure 6A:
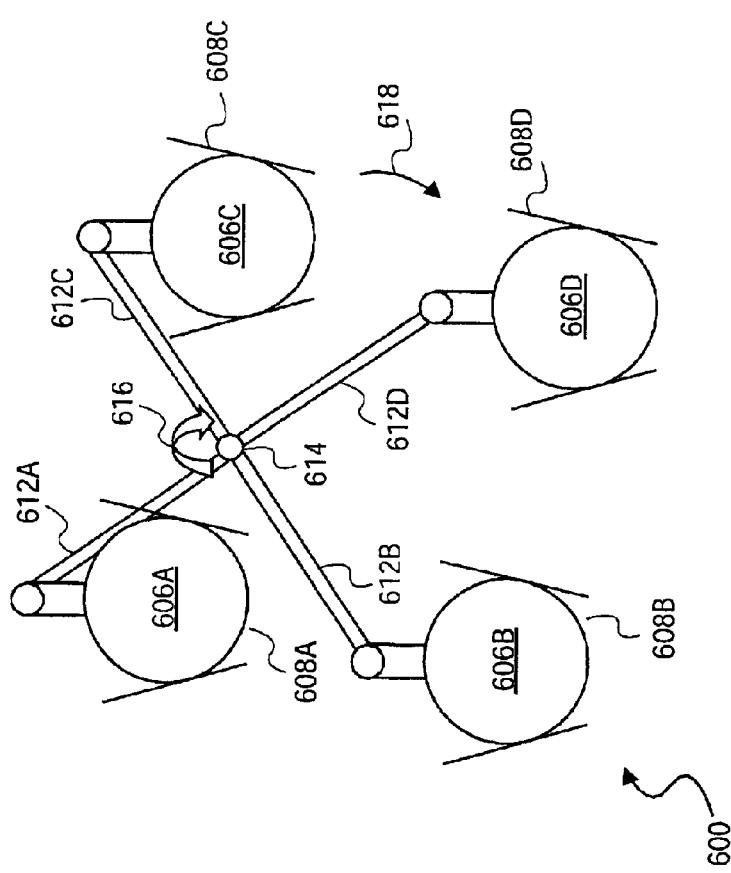

FIGS. 6A and 6B show a stripping mechanism 600 for use in semiconductor fabrication, according to another embodiment of the invention. The stripping mechanism 600 is similar to the stripping mechanism 400 of FIGS. 4A and 4B. The difference is that the stripping mechanism 600 has four semiconductor wafer holders 608a, 608b, 608c, and 608d swivably mounted to four spokes 612a, 612b, 612c, and 612d, respectively. The semiconductor wafers stored in the holders 608a, 608b, 608c, and 608d are indicated as the wafers 606a, 606b, 606c, and 606d. Except for the increased number of semiconductor wafer holders, the stripping mechanism 600 otherwise operates as does the stripping mechanism 400 of FIGS. 4A and 4B.

Thus, the swivable mounting of the holders 608a, 608b, 608c, and 608d to the spokes 612a, 612b, 612c, and 612d, respectively, allows the holders 608a, 608b, 608c, and 608d to maintain substantially their horizontal and vertical configuration as the spokes 612a, 612b, 612c, and 612d rotate. The spokes 612a, 612b, 612c, and 612d rotate because they are mounted on one end to a gear 614, corresponding to the axis of rotation, that rotates as indicated by the arrow 516. The spokes 612a, 612b, 612c, and 612d are mounted on another end to their corresponding holders 608a, 608b, 608c, and 608d, as indicated as the mounts 610a, 610b, 610c, and 610d. The rotation of the spokes 612a, 612b, 612c, and 612d correspondingly causes the holders 608a, 608b, 608c, and 608d, and their wafers 606a, 606b, 606c, and 606d, to rotate, as indicated by the arrow 618. The rotation of the wafers 606a, 606b, 606c, and 606d about the axis of rotation, while maintaining a substantially constant horizontal and vertical configuration, allows for two-dimensional relative motion between the wafers 606a, 606b, 606c, and 606d and the chemical 604 in the container 602.

Figure 7:
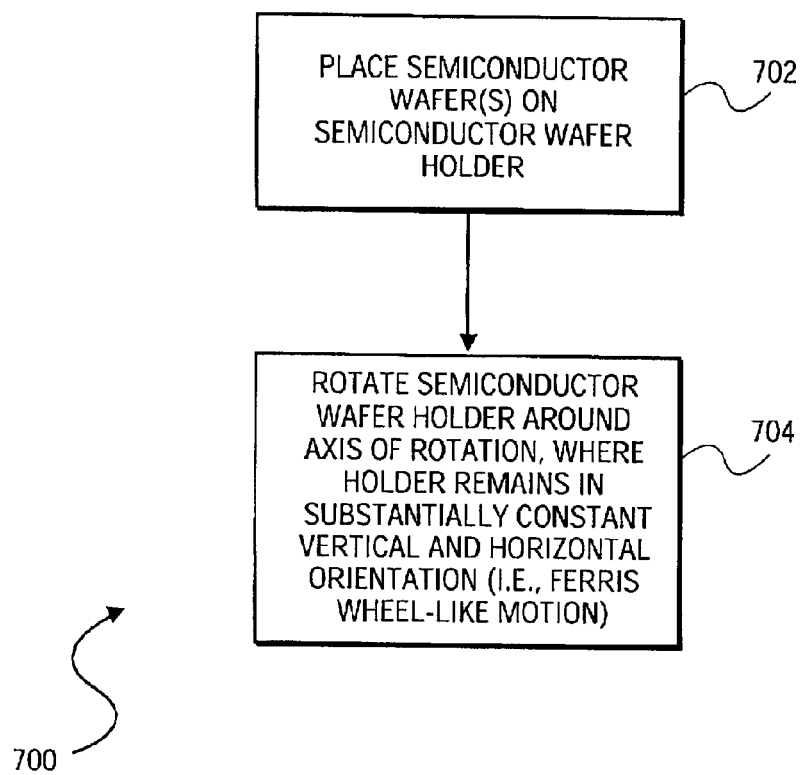
FIG. 7 is a flowchart of a method for Ferris wheel-like stripping, such as photoresist or other stripping, according to an embodiment of the invention.

FIG. 7 shows a method 700 for accomplishing Ferris wheel-like stripping, according to an embodiment of the invention. First, semiconductor wafer(s) are placed on or in a semiconductor wafer holder (702). Next, the semiconductor wafer holder is moved through a stripping chemical in a Ferris wheel-like motion (704). The wafer holder remains substantially constant as to its vertical and horizontal orientation, as the it rotates around an axis of rotation. This rotation can be accomplished by, as has been described, the holder being swivably mounted to a wheel that rotates, or by the holder being swivably mounted to a spoke that rotates, and so on.

It is noted that, although specific embodiments have been illustrated and described herein, it will be appreciated by those of ordinary skill in the art that any arrangement is calculated to achieve the same purpose may be substituted for the specific embodiments shown. For instance, whereas the invention is substantially described in relation to photoresist stripping, it is applicable to wafer cleaning as well. The chemical used may thus be a photoresist stripping chemical, a semiconductor wafer cleaning chemical, or another type of chemical. The wafer cleaning may be cleaning polymer from the wafer after metal or via etching. This application is intended to cover any adaptations or variations of the present invention. Therefore, it is manifestly intended that this invention be limited only by the claims and equivalents thereof.

What is claimed is:

1. A semiconductor fabrication stripping tool comprising:
   a container adapted to hold a semiconductor fabrication stripping agent; and,
   a component to move one or more semiconductor wafers through the stripping agent in the container in a Ferris wheel-like motion to strip a semiconductor fabrication substance from the semiconductor wafers.

2. The mechanism of claim 1, wherein the component comprises one or more wafer holders swivably mounted about an axis of rotation, such that as the one or more wafer holders rotate about the axis of rotation, the one or more wafer holders remain in a substantially constant vertical and horizontal orientation, each of the one or more wafer holders vertically holding at least one of the one or more semiconductor wafers, such that no wafer is in contact with any other wafer.

3. The mechanism of claim 1, wherein the component comprises:
   a wheel rotating around an axis of rotation through the stripping agent in the container; and,
   one or more wafer holders, each wafer holder swivably mounted to a position on the wheel such that the wafer holder has a substantially constant vertical and horizontal orientation as the wheel rotates around the axis of rotation, the wafer holder holding at least one of the one or more semiconductor wafers.

4. The mechanism of claim 3, wherein the component further comprises a gear to which the wheel is mounted and that rotates to correspondingly rotate the wheel around the axis of rotation.

5. The mechanism of claim 1, wherein the component comprises:
   a spoke rotating around an axis of rotation through the stripping agent in the container, the spoke having a first end at the axis of rotation and a second end; and,
   a wafer holder swivably mounted to the second end of the spoke such that the wafer holder has a substantially constant vertical and horizontal orientation as the spoke rotates around the axis of rotation, the wafer holder holding at least one of the one or more semiconductor wafers.

6. The mechanism of claim 5, wherein the component further comprises a gear to which the spoke is mounted and that rotates to correspondingly rotate the spoke around the axis of rotation.

7. The mechanism of claim 5, wherein the component further comprises:
   one or more additional spokes rotating around the axis of rotation through the stripping agent in the container, each additional spoke having a first end at the axis of rotation and a second end; and,
   one or more additional wafer holders, each wafer holder swivably mounted to the second end of a corresponding additional spoke such that the wafer holder has a substantially constant vertical and horizontal orientation as the corresponding additional spoke rotates around the axis of rotation, each wafer holder holding at least one of the one or more semiconductor wafers.

8. The mechanism of claim 7, wherein the component further comprises a gear to which the spoke and the one or more additional spokes are mounted and that rotates to correspondingly rotate the spoke and the one or more additional spokes around the axis of rotation.

9. A semiconductor fabrication stripping tool comprising:

a container to hold a semiconductor fabrication stripping agent; and, one or more wafer holders swivably mounted about an axis of rotation, such that as the one or more wafer holders rotate about the axis of rotation through the in the container to strip a semiconductor fabrication substance from the semiconductor wafers, the one or more wafer holders remain in a substantially constant vertical and horizontal orientation, each of the one or more wafer holders vertically holding at least one semiconductor wafer, such that no wafer is in contact with any other wafer.

10. The mechanism of claim 9, further comprising a wheel rotating around the axis of rotation through the stripping agent in the container, each wafer holder mounted to a different position on the wheel.

11. The mechanism of claim 10, further comprising a gear to which the wheel is mounted and that rotates to correspondingly rotate the wheel around the axis of rotation.

12. The mechanism of claim 9, further comprising a spoke corresponding to each wafer holder rotating around the axis of rotation through the stripping agent in the container and having a first end at the axis of rotation and a second end to which the wafer holder is swivably mounted.

13. The mechanism of claim 12, further comprising a gear to which the spoke corresponding to each wafer holder is mounted and that rotates to correspondingly rotate the spoke corresponding to each wafer holder around the axis of rotation.

14. A method comprising:

placing one or more semiconductor wafers on a semiconductor wafer holder; and, moving the semiconductor wafer holder through a chemical in a Ferris wheel-like motion.

15. The method of claim 14, wherein moving the semiconductor wafer holder comprises rotating the semiconductor wafer holder around an axis of rotation such that the semiconductor wafer holder remains in a substantially constant vertical and horizontal orientation.

16. The method of claim 14, wherein moving the semiconductor wafer holder comprises rotating a wheel to which the semiconductor wafer holder is swivably mounted around an axis of rotation, such that the wafer holder has a substantially constant vertical and horizontal orientation as the wheel rotates around the axis of rotation.

17. The method of claim 14, wherein moving the semiconductor wafer holder comprises rotating a spoke having a first end at an axis of rotation and a second end to which the semiconductor wafer holder is swivably mounted around the axis of rotation, such that the wafer holder has a substantially constant vertical and horizontal orientation as the spoke rotates around the axis of rotation.

18. The method of claim 14, wherein the chemical is one of a photoresist stripping chemical and a wafer cleaning chemical.

* * * * *